United States Patent
Wu et al.

(10) Patent No.: US 7,076,326 B2
(45) Date of Patent: Jul. 11, 2006

(54) PROACTIVE STAGING FOR DISTRIBUTED MATERIAL HANDLING

(75) Inventors: Johnny Hsiang Wu, Portland, OR (US); Bo Li, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/680,600

(22) Filed: Oct. 6, 2003

(65) Prior Publication Data
US 2005/0075751 A1   Apr. 7, 2005

(51) Int. Cl.
*G06F 7/00* (2006.01)

(52) U.S. Cl. ............... 700/213; 700/100; 700/112; 414/940

(58) Field of Classification Search ............ 700/228, 700/213, 99, 100, 101, 102, 112; 414/935, 414/940, 805
See application file for complete search history.

(56) References Cited

U.S. PATENT DOCUMENTS

| | | | | |
|---|---|---|---|---|
| 5,751,581 A | * | 5/1998 | Tau et al. | 700/115 |
| 6,050,768 A | * | 4/2000 | Iwasaki et al. | 414/222.01 |
| 6,108,585 A | * | 8/2000 | Ryan et al. | 700/112 |
| 6,351,686 B1 | * | 2/2002 | Iwasaki et al. | 700/228 |
| 6,356,804 B1 | | 3/2002 | Conboy et al. | |
| 6,438,441 B1 | * | 8/2002 | Jang et al. | 700/121 |
| 6,443,686 B1 | | 9/2002 | Wiesler et al. | |
| 6,580,967 B1 | * | 6/2003 | Jevtic et al. | 700/228 |
| 6,622,057 B1 | * | 9/2003 | Ko et al. | 700/113 |
| 6,662,076 B1 | * | 12/2003 | Conboy et al. | 700/214 |
| 6,687,568 B1 | * | 2/2004 | Ohtsuka et al. | 700/213 |
| 6,733,243 B1 | * | 5/2004 | Ogata et al. | 414/217 |

* cited by examiner

*Primary Examiner*—Khoi H. Tran
(74) *Attorney, Agent, or Firm*—Schwabe, Williamson & Wyatt, P.C.

(57) ABSTRACT

A system, method, and/or program that enables a material handling system to proactively stage lots at ideally located stockers. Input containing the lots to be processed on a process machine is entered into a manual order queue ("MOQ"). The system, method, and/or program then proactively determines the location for the staging of the lots to be processed based at least in part on the state of the stockers.

10 Claims, 5 Drawing Sheets

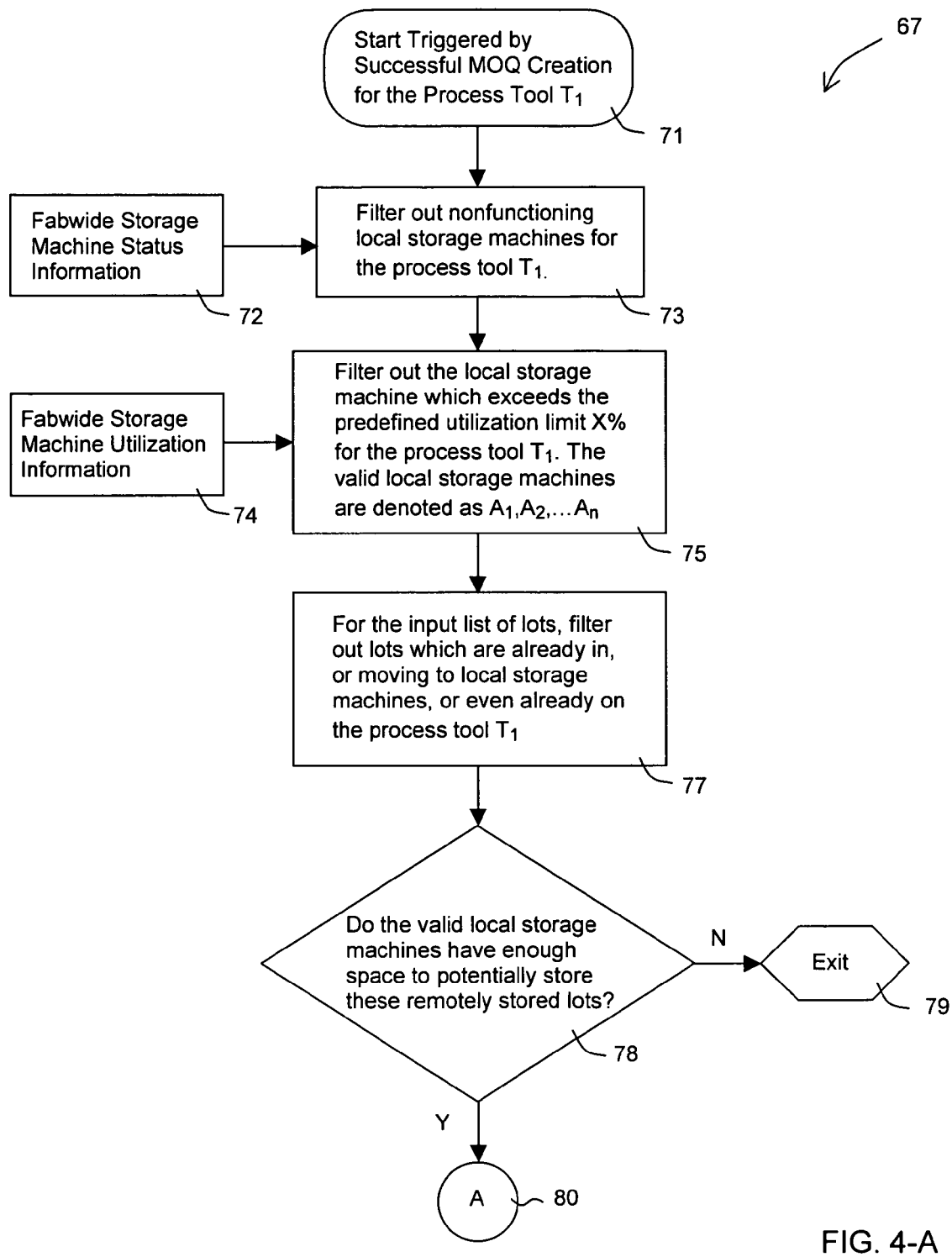
FIG. 4-A

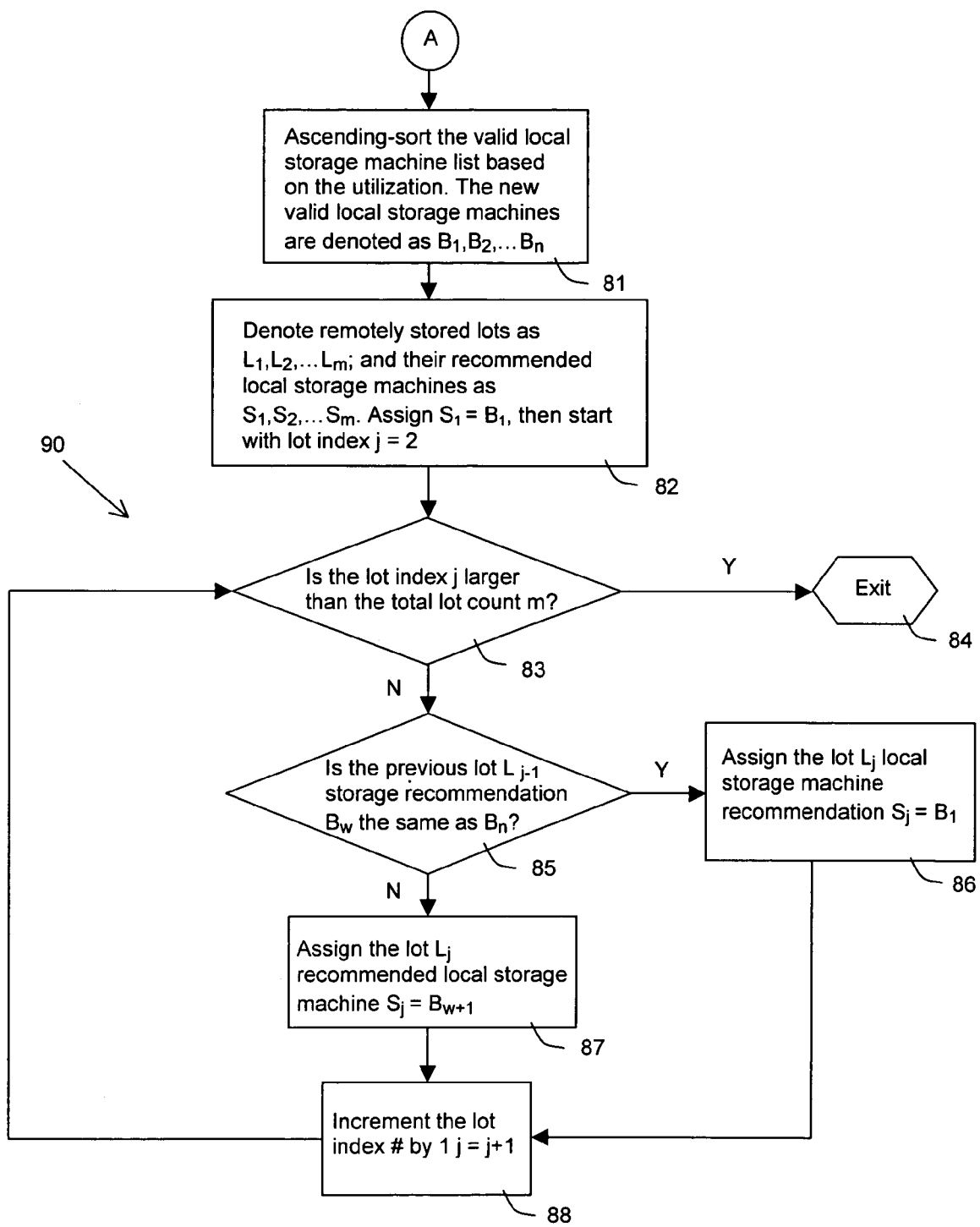
FIG. 4-B

PROACTIVE STAGING FOR DISTRIBUTED MATERIAL HANDLING

FIELD OF THE INVENTION

The present invention relates to factory material control and delivery methods and, more particularly, to systems and methods for intelligent automation of routing, distribution, and scheduling of material carriers at process and storage machines.

BACKGROUND OF INVENTION

In many factory settings, and in particular, the semiconductor device factory, material handling systems convey carriers, each containing a predetermined quantity of material known as a "lot," between stockers, which are carrier storage machines, and process machines which process the lots (hereinafter, a singular reference to "lot" may also include the "carrier" on which it is transported).

FIG. 1 is a diagram schematically showing an exemplary floor plan of a factory for manufacturing semiconductor devices, and FIG. 2 is a diagram schematically showing a conveying control system 50. The conveying of an individual lot 10 between multiple stockers 41,42,43 and between a stocker 41,42,43 and a process machine 31 is conducted by means of a conveyor 25 controlled by the conveying control system 50.

By way of example, FIG. 1 illustrates a view of a process line 20, including a process machine 31 and three stockers 41,42,43. The conveyor 25 can take many forms, commonly being an elevated railway. The receiving and issuing of the lot 10 to and from the process machine 31 and the stockers 41,42,43 along the conveyor 25 is conducted by, for example, a lifting trolley.

A conventional system for controlling the conveyance of the lots 10 will be described with reference to FIGS. 1 and 2. Referring now to FIG. 2, the conveying control system 50 comprises a user interface ("UI") 52, an execution control system ("ECS") 54, and a material control system ("MCS") 56, interconnected with a communication network 58. The ECS 54 comprises a host computer 53 comprising a predefined static flat file that contains a map of a particular lot 10 to a predetermined stocker 41,42,43. A user, such as a manufacturing technician, interacts with the UI 52 to implement a command to the ECS 54. The ECS 54 communicates the command to the MCS 56 for implementation. The communication may be conveyed directly or indirectly.

The MCS 56 includes a carrying host computer 57 that is adapted to accept commands from the ECS 54 to convey a lot 10, and to receive and transmit necessary control data, also referred to as a conveying pattern, to control the conveyor 25 along a conveying path for the conveyance of the lot 10 from, for example, a process machine 31 to one of the stockers 41,42,43. The MCS 56 communicates to the ECS 54 via a network 58 that the command was executed. The ECS 54 updates the lot map and communicates to the UI 52 that the MCS 56 has delivered the lot 10 to one of the stockers 41,42,43, notifying the user.

The static flat file within the host computer 53 does not contain and does not receive state data regarding the status of the stockers 41,42,43, such as whether stockers 41,42,43 are operating and have capacity to store additional lots 10. Further, the static flat file does not provide for the reception of utilization information that would provide for utility status across multiple potentially available stockers 41,42,43 on the same factory floor.

The methodology of the static flat file within the host computer 53 is to store the lot 10 in the best known stocker 41,42,43 location at the time the lot has finished being processed at a previous operation. However, the chosen stocker location is not always ideal for a particular process machine 31 used next in the process. Also multiple process machines 31 that provide the same process operation may be physically located in several different places on the factory floor with varying distances from the stockers 41,42,43. Another problematic factor is the need to convey and redistribute lots 10 between stockers 41,42,43 to alleviate those that are near capacity limits.

These issues result in less than optimal efficiencies, including long delivery times of the lots to a process machine 31, resulting from retrieving lots 10 stored in nonoptimal locations. Nonoptimal locations include, among others, those locations where the stockers 41,42,43 are not in close proximity to the process machine 31 which is about to process the lot. Long material delivery times contribute to process machine idle time, as the process machine 31 is waiting for the material delivery. This in turn translates to longer process cycle times. Furthermore, delivery delay at one process machine 31 also impacts downstream process machine utilization. Consequently, long material delivery times cause significant overall throughput delays in semiconductor manufacturing.

BRIEF DESCRIPTION OF DRAWINGS

FIG. 4A-B is a flowchart of a storage process, in accordance with an embodiment of the invention.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

In the following description, an automated material handling system ("AMHS") providing proactive staging is described in terms of equipment and methods that are found in the semiconductor factory. Numerous specific details are set forth in order to provide a thorough understanding of the present invention. It will be readily apparent, however, to one skilled in the art that the present invention can be practiced without these specific details. In other instances, some details have been omitted in order to avoid obscuring the present invention. Therefore, other configurations and factory settings involving an automated material handling system are also within the scope of the present invention.

In the following description, a number of terms of art are used, as defined by the following:

Proactive Staging—The purposeful staging of lots.

Intelligent Material Storage and Distribution ("IMSD")—The process of choosing the best operational stockers while filtering out the down or off-line stockers from the candidate operational stockers.

Automated Material Handling System ("AMHS")—A system that conveys lots from stocker to stocker, stocker to process machine, or process machine to process machine using a series of overhead track/railways, robotic vehicles, and the like.

Carrier—A box, rack, or container that holds up to 25 wafers and designed to be conveyed via the AMHS.

Lot—A collection of up to, e.g., 25 wafers that are grouped together for processing.

Material Control System ("MCS")—Logic control, such as software, that sends commands to the AMHS to convey the carriers in the factory.

Manual Order Queue ("MOQ")—A logical queue designed to receive input of lots to be processed by a targeted process machine.

Stocker—A storage machine used in the AMHS system. A stocker can store anywhere from, e.g., 100 to 200 carriers.

Figure 1:
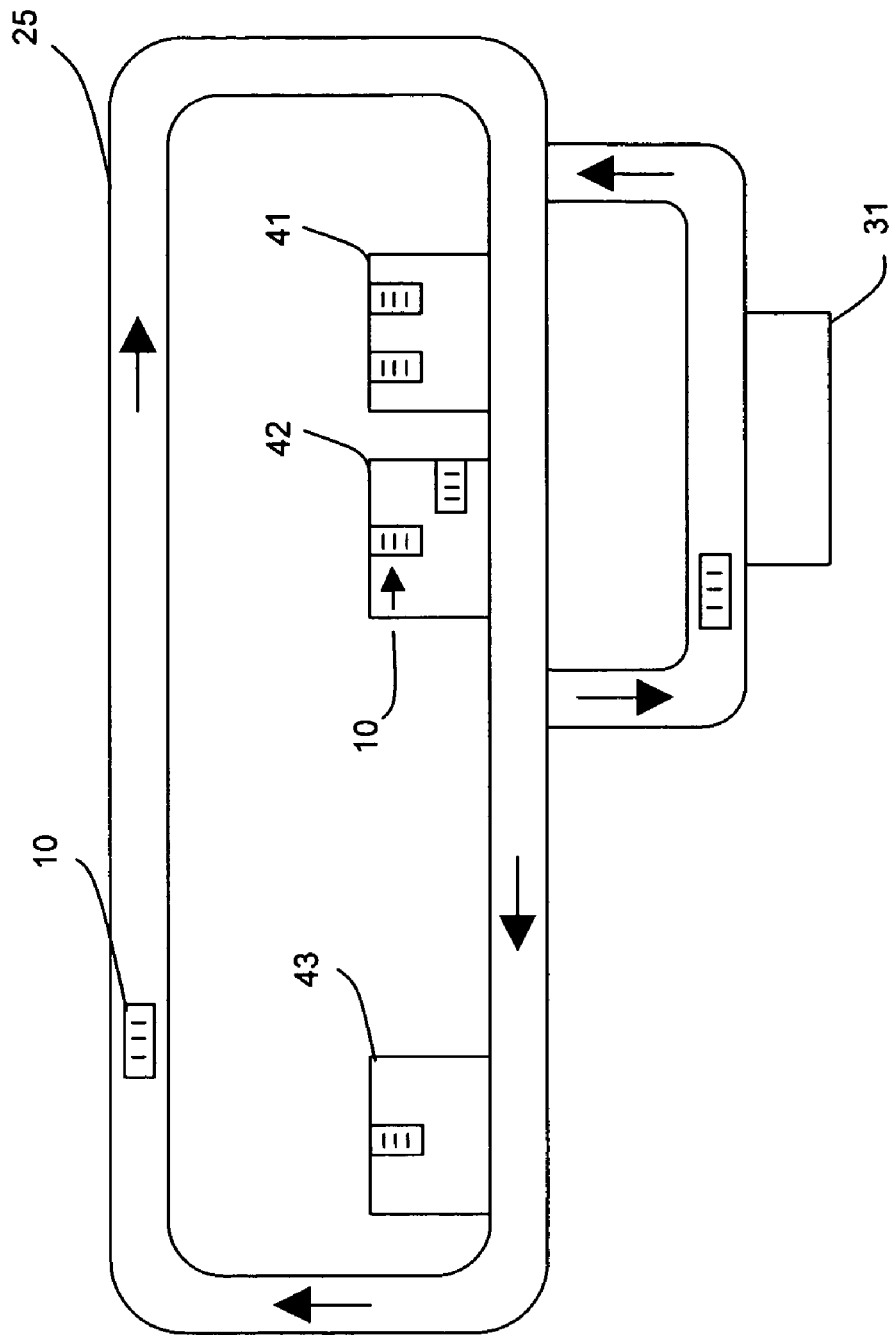
FIG. 1 is a diagram schematically showing an exemplary floor plan of factory for manufacturing semiconductor devices.
Figure 2:
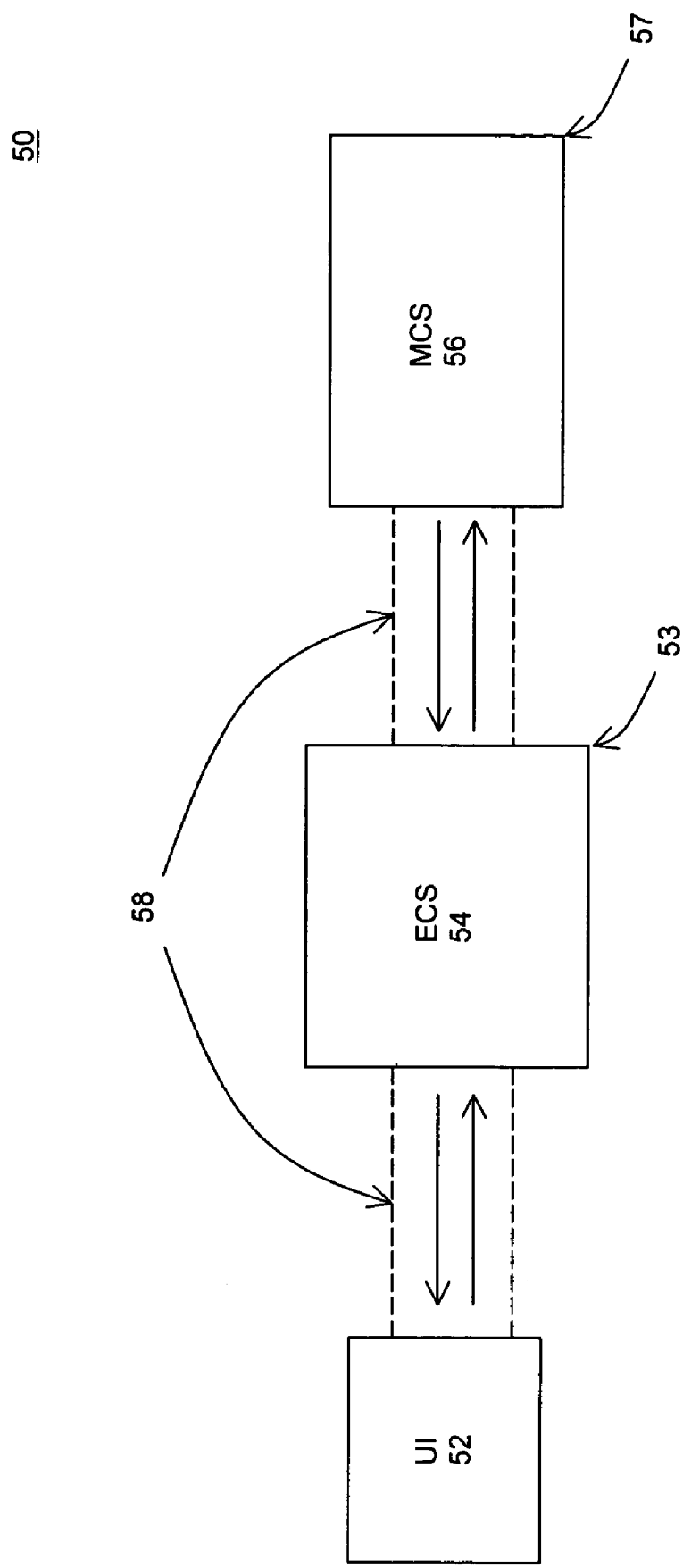
FIG. 2 is a diagram schematically showing a prior art conveying control system.
Figure 3:
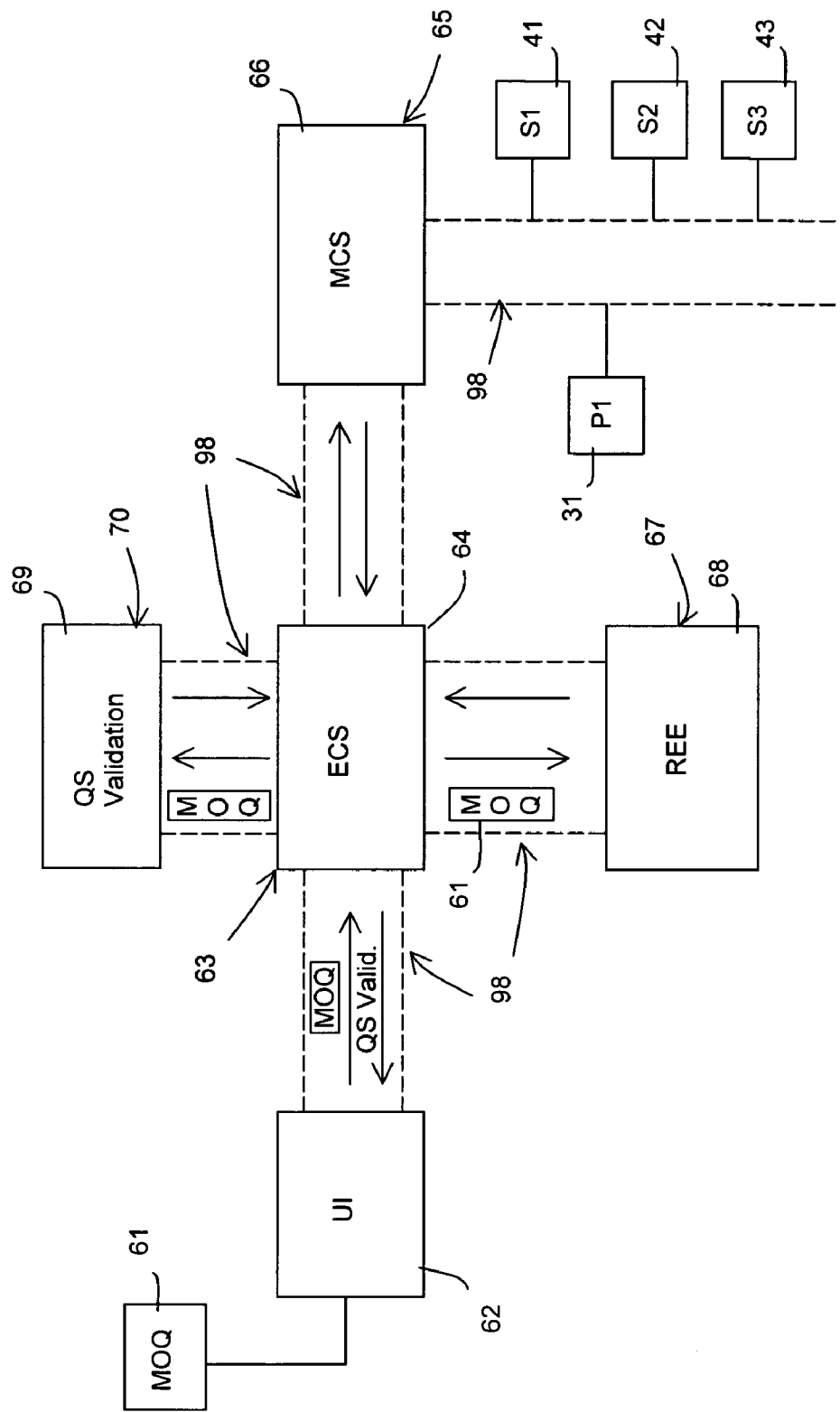
FIG. 3 is a schematic of a proactive automated material handling system, in accordance with embodiments of the present invention.

FIG. 3 is a schematic of a proactive automated material handling system ("P-AMHS") 60, in accordance with embodiments of the present invention. Referring also to FIG. 1 illustrating an example process line 20, the conveying of an individual lot 10 between multiple stockers 41,42,43 and between a stocker 41,42,43 and a process machine 31 is conducted by means of a conveyor 25 controlled by the P-AMHS 60. The P-AMHS 60 provides a proactive staging conveying pattern that intelligently conveys each lot 10 targeted to be processed along a conveying path to an ideally located (or almost ideal) local operational stocker 41,42,43 to await processing by the process machine 31.

The process line 20 includes a process machine 31 and one or more stockers 41,42,43, in this example three, of varying proximity to the process machine 31. The conveyor 25 can take many forms, such as, but not limited to, an elevated railway. The receiving and issuing of the lot 10 to and from the process machine 31 and the stockers 41,42,43 along the conveyor 25 is conducted by, for example, a lifting trolley.

In the embodiment shown in FIG. 3, the P-AMHS 60 comprises a user interface ("UI") 62, an execution control system ("ECS") 64, a queuing server ("QS") 69, a rule evaluation engine ("REE") 68, and a material control system ("MCS") 66, interconnected with a communication network 98. The ECS 64 comprises a host computer 63 that provides centralized command and control between the UI 62, QS 69, REE 68, and MCS 66.

The UI 62 is adapted to receive data from a user for a desired operation of the P-AMHS 60. The user (e.g., engineer or manufacturing technician) interacts with the UI 62 to queue up work for a particular process machine 31. This may be accomplished by dragging and dropping lot numbers from a list of lots into an "MOQ 61 window" on the UI 62. The MOQ may also specify the order that lots will be processed on the process machine 31. When the user saves the MOQ, the UI 62 communicates the MOQ 61 to the ECS 64 via the network 98. The ECS 64 contains business logic to route data via the network 98 between the queuing server ("QS") 69, the rule evaluation engine (REE) 68, and the material control system ("MCS") 66 for implementation.

The ECS 64 communicates the content of the MOQ 61 to the QS 69. The QS 69 ensures the list of lots 10 in the MOQ 61 is valid and then stores the list in a database 70 for future use. The QS 69 communicates back to the ECS 64 the validity of the list and whether the list has been added to the database 70. The ECS 64 communicates the information from the QS 69 to the UI 62, and therefore, to the user.

The ECS 64 routes the MOQ 61 information to the REE 68. The ECS 64 also receives real-time status information about each of the stockers 41,42,43 from the MCS 66, via the network 98. Each stocker 41,42,43 signals the MCS 66 with, among other things, real-time information on availability (i.e., whether the stocker is online and functioning) and/or loading status (i.e., the number of lots stored in the stocker and the number of lots assigned to the stocker but not yet stored). The MCS 66 communicates this real-time status information to the ECS 64 which, in turn, routes it to the REE 68. The REE 68 uses this real-time status information, information about proximity of stockers 41,42,43 to process machine and stocker storage capacity to determine the stocker state. Other embodiments may include the real-time information being directly communicated to the REE 68. In another embodiment the loading information may be stored and accessed from memory rather than reported from the stocker. The memory may be located in, for example, either the ECS host computer 63 or the MCS host computer 65.

The REE 68 uses the stocker state to develop proactive staging instructions using a flexible, easily modified, rule-based storage process 67. In one embodiment, the rule-based storage process 67 is executed from a machine accessible medium. Examples of such a machine accessible medium, include, but are not limited to random access memory ("RAM"), read-only memory ("ROM"), hard disk drive, a tape drive, CD-ROM/DVD-ROM drive, and/or a floppy disk drive.

The proactive staging instructions, developed by the rule-based storage process 67, are designed to intelligently convey each lot 10, targeted in the MOQ, to an ideally located local operational stocker 41,42,43 to await processing by the process machine 31. This proactive staging provides strategic placement of the lots prior to the lots being called for processing. The storage process 67 determines the lots 10 that are candidates for proactive staging, i.e., lots that are located remotely from the process machine 31. The storage process 67 also determines which of the stockers 41,42,43 provide the ideal location for the storage of each of the lots 10 prior to processing. In one embodiment the ideal storage location may be a local, available stocker with a low utilization rate. If there are several ideal storage locations, it may be desirable, but not necessary, to uniformly distribute the remotely located lots among them. This may provide efficient collection of the lots 10, by enabling either simultaneous or sequential pick-up/delivery of the lots to the appropriate queue or process machine 31.

A lot 10 or a stocker 41,42,43 is considered 'local' if it is proximally located to the designated process machine. Proximally located lots and stockers are system specific and may vary depending on the application. In one embodiment a proximally located stocker may be one that is located on the same sub-system as the process machine. For example, referring to FIG. 1, stockers 41 and 42 may be considered local to process machine 31, and stocker 43 may be considered remote. In another embodiment a proximally located stocker could be one that is within a certain, predefined, travel time to a particular process machine. In another embodiment, a proximally located stocker could be one that is within a certain, predefined, conveyor distance to a particular process machine. In an embodiment, a lot may be in a first stocker that may be considered a remote stocker, and a second stocker that is closer to the particular process machine than the remote stocker may be considered a local or proximally located stocker. The closeness of the remote stocker in comparison with the local stocker may be determined by which is closer to the process machine as measured by distance along the conveyor system, which is closer to the process machine as measured by the time it would take a conveyor system to transfer the lot from the stockers to the process machine, or through other measurements.

The rule-based storage process 67 provides overall system efficiency by proactively assigning lots 10 to a strategic stocker so that they will be timely delivered to the process machine 31 when called. Among other advantages, this may reduce process machine 31 idle time between each lot processing and waiting for the next lot 10 to be delivered. After the rule-based storage process has developed the proactive staging instructions the REE 68 communicates the instructions to the ECS 64.

The ECS 64 processes the staging instructions and communicates the resulting transport control instructions to the MCS 66. The MCS 66 comprises a carrying host computer 65 that is adapted to accept and process the transport control instructions from the ECS 64. The MCS 66 then executes the instructions and controls the conveyor 25 for the conveyance of the targeted lots 10 to the desired location. The MCS 66 communicates to the ECS 64 that the conveyance of the lots 10 was executed. The ECS 64 updates the lot map (lot-stocker assignments) and communicates to the UI 62 that the MCS 66 has delivered each lot 10 to a specified stocker 41,42,43, thereby notifying the user.

FIG. 4A-B is a flowchart of a rule-based storage process 67, in accordance with an embodiment of the present invention. The storage process 67 can be modified to improve logic or be customized to reflect a particular semiconductor factory layout, for example. The methodology for an embodiment of the rule-based storage process 67 comprises the following.

Initiation of the rule-based storage process 67 is triggered by input to the MOQ 71. Information related to the availability of each stocker is provided to a first filter 72. The first filter 72 determines the operational stockers by deselecting the down or offline stockers from the candidate stockers 73.

Information related to the utilization of each stocker is provided to a second filter 74. Stocker utilization is a function of lot loading divided by lot storage capacity of the stocker. The second filter 74 determines the valid operational stockers $A_1, A_2, \ldots A_n$ while deselecting the stockers that exceed a predefined utilization limit of X % 75.

A determination is made of the remaining lots requiring conveyance based upon the list of lots defined by an MOQ. Those lots which are already in the optimal local stocker, in transit to the optimal local stocker, or at the process machine are disregarded 77. A capacity check is done on the valid local stockers to determine if they have enough space to potentially store the remotely stored lots 78. If so, the remotely stored lots will be assigned to valid local stockers based on the process such as the one depicted in the embodiment of FIG. 4-B.

Referring to FIG. 4-B, the valid local stockers are listed and sorted by their utilization information in ascending order. Beginning with the least utilized valid local stocker, the stockers will be relabeled $B_1, B_2, \ldots B_n$ 81. Lots that are eligible for stocker assignment, i.e., remotely stored lots, are labeled as $L_1, L_2, \ldots L_m$. Their recommended local stockers are designated by $S_1, S_2, \ldots S_m$ 82. $S_1$ is assigned $B_1$, and lot index j is initialized at 2.

After initial ordering and labeling, the present embodiment enters a round-robin subroutine 90 in order to assign remotely stored lots with valid local stockers. The threshold module determines if there has been an association for every remotely stored lot by reference to index number j 83. If the lot index j is larger than the total number of remotely stored lots then sub-routine is exited 84. If not, is the previous lot $L_{j-1}$ stocker recommendation $B_w$ the same as $B_n$ 85? That is, have all the stockers been assigned in the current rotation? If they have ($B_w=B_n$) then $lot_j$ local stocker recommendation will be $B_1$. If all of the valid local stockers have not yet been assigned in the current rotation, then the $lot_j$ recommended stocker, $S_j$, will be the next local valid stocker in the rotation, $B_{w+1}$ 87. The index j will be incremented 88, and the round-robin subroutine will begin again by checking to see whether all of the remotely stored lots have been associated with valid local stocker 83. This process is repeated until all of the remotely stored lots have been assigned a valid local stocker.

This round-robin subroutine 90 is used to distribute and balance a batch of lots 10 between multiple local stockers 41 and 42. In FIG. 1, stocker 43 may be considered a nonoptimal stocker because it is not proximally located to the process machine 311. The balanced stocker loading ensures that multiple lots 10 can be picked up by the P-AMHS in parallel for delivery. This prevents, among other things, multiple lots 10 at one local stocker 41, from queuing up to wait for delivery, while the other local stocker 42 is idle.

Other embodiments of this invention could include logic to fill the least utilized local stocker with consecutive remotely stored lots until the stocker is no longer the least utilized. This embodiment would be particularly advantageous in assembly line situations that would not be prone to the backup caused by over-assigning remote lots to one underutilized local stocker. Yet another embodiment could include reassessing utilization and ordering of local stockers after a certain number of lot assignments. This embodiment would be particularly advantageous because it could prevent the lots from backing up while concentrating flow of the remote lots to the least utilized of the local stockers.

Proactive staging based on embodiments of the present invention, has been demonstrated to show the possibility of a dramatically reduced lot delivery time with corresponding improved process machine utilization. This capability is generic and can be applied to all process machine types in semiconductor manufacturing, as well as other manufacturing. Since it is generic, development and implementation cycle-time may be dramatically shortened for different process machines.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A system comprising:
    a user interface configured to receive an identification of a lot to be processed on a process machine;
    a plurality of stockers, each having a respective closeness to the process machine that is within a predetermined threshold closeness; and an engine coupled to the user interface and configured
- to receive closeness information on each of the plurality of stockers,
- to determine if the lot is located outside of the predetermined threshold closeness, and
- to generate staging instructions to move the lot to a selected one of the plurality of stockers based at least in part on said determining if the lot is located outside of the predetermined closeness, received closeness information and relative utilization of the plurality of stockers.

2. The system of claim 1, wherein the lot is one of a plurality of lots to be processed on the process machine and the user interface is further configured to receive an identification of the plurality of lots, the system further comprising:
- a control system; and
- a queuer, communicatively coupled to the control system, to validate a list of the plurality of lots received by the user interface, record the list in a database, and communicate the validity of the list and presence of the list in the database to the control system.

3. The system of claim 2, wherein the control system is further capable of communicating to the user interface a validity of the list and presence of the list in the database.

4. The system of claim 1, wherein the engine is further configured to periodically update a location of the lot prior to the lot being processed and to generate further staging instructions based at least in part on one or more of said periodical updates.

5. A machine-accessible medium comprising a plurality of instructions, which when executed cause an engine to
- receive input over a first data connection, input including identification of a lot to be processed by a process machine;
- receive closeness information on closeness of each of a plurality of stockers to the process machine, the relative closeness of each of the plurailty of stockers being within a predetermined threshold closeness to the process machine;
- determine, upon receipt of said input, if the lot is located outside of the predetermined threshold closeness; and
- generate staging instructions to move the lot to a selected one of the plurality of stockers based at least in part on said determining if the lot is located outside of the predetermined closeness, received closeness information and relative utilization of the plurality of stockers.

6. The machine-accessible medium of claim 5, wherein the plurality of instructions, when executed further cause the engine to
- periodically update a location of the lot prior to the lot being processed and to generate further staging instructions based at least in part on one or more of said periodical updates.

7. The machine-accessible medium of claim 5, wherein the lot is one of a plurality of lots to be processed on the process machine and the plurality of instructions, when executed further cause the engine to
- determine which of the plurality of lots are located outside the predetermined threshold closeness; and
- generate staging instructions to move any of the plurality of lots determined to be outside of the predetermined threshold closeness to one or more of the plurality of stockers.

8. The machine-accessible medium of claim 7, wherein the plurality of instructions, when executed further cause the engine to
- generate staging instructions to substantially uniformly distribute any of the plurality of lots determined to be outside of the predetermined threshold closeness over at least a subset of the plurality of stockers.

9. The system of claim 1, wherein the lot is one of a plurality of lots to be processed on the process machine and the engine is further configured
- to determine which of the plurality of lots are located outside the predetermined threshold closeness; and
- to generate staging instructions to move any of the plurality of lots determined to be outside of the predetermined threshold closeness to one or more of the plurality of stockers.

10. The system of claim 9, wherein the engine is further configured to
- generate staging instructions to substantially uniformly distribute any of the plurality of lots determined to be outside of the predetermined threshold closeness over at least a subset of the plurality of stockers.

* * * * *